Aug. 8, 1961 E. H. HUGENHOLTZ 2,995,669
TRANSISTORIZED PULSE GENERATOR
Filed March 4, 1959
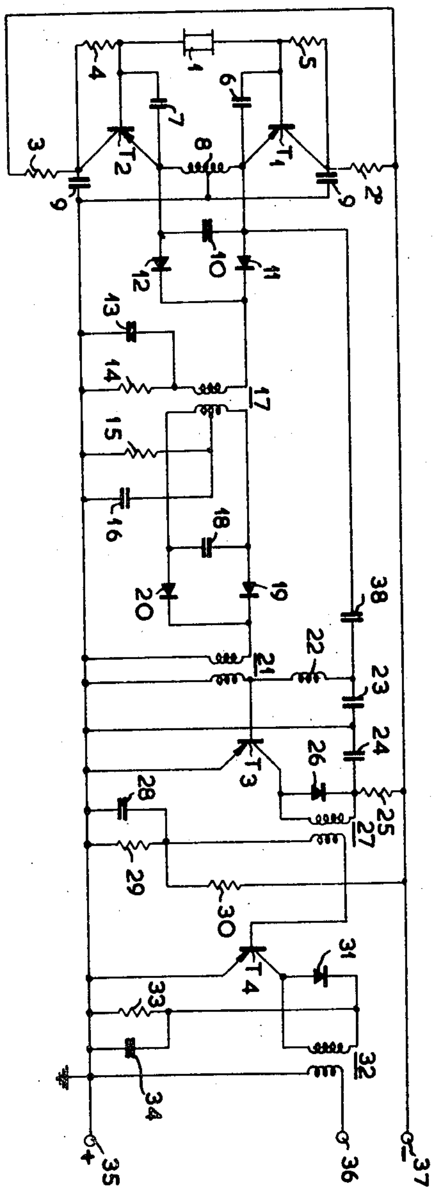
INVENTOR
EDUARD H. HUGENHOLTZ
BY
Frank R. Jifani
AGENT United States Patent Office 2,995,669

Patented Aug. 8, 1961

2,995,669

TRANSISTORIZED PULSE GENERATOR

Eduard Herman Hugenholtz, Toronto, Ontario, Canada, assignor to North American Philips Company, Inc., New York, N.Y., a corporation of Delaware Filed Mar. 4, 1959, Ser. No. 797,172
Claims priority, application Canada Apr. 3, 1958
7 Claims. (Cl. 307—88.5)

My invention relates to a transistorized pulse generator which is capable of producing pulses rich in harmonics at a high recurrence frequency.

My invention finds application in frequency control systems wherein the frequency of a high frequency oscillator is stabilized or synchronized with respect to a harmonic of a lower stabilized frequency. Crystal stabilization of the lower frequency is generally employed. The oscillator to be controlled normally operates at a frequency at which crystal stabilization is not practical or due to the number of crystals which are necessary if a number of frequencies of operation are to be available the cost becomes prohibitive. My invention may also be employed as the master oscillator for a pulse radar or other analogous system wherein it is desirable to reduce size and power requirements of the equipment.

It is, therefore, an object of my invention to provide a transistorized pulse generator capable of operating at high frequencies to produce pulses rich in harmonics.

It is a further object of my invention to provide a transistorized pulse generator capable of producing an output pulse which is short in time in comparison to the pulse recurrence frequency.

In carrying out my invention a first transistor is biased to provide a small collector current while precautions are taken to maintain the collector to emitter voltage at a low value so that overloading of the transistor will not occur. A first alternating voltage is applied to the transistor to render the collector alternately heavily conducting and non-conducting, a second alternating voltage, preferably a periodically recurrent pulse voltage is applied to the transistor to render the collector substantially non-conducting for a short time during the period in which it is caused to be heavily conducting by the first alternating voltage so that a voltage pulse is generated in an output circuit connected in series with the collector electrode.

In a preferred embodiment of my invention, an oscillator, operating at a fundamental frequency of, for example, 1 megacycle, supplies its output to a cascaded pair of rectifier frequency doubler circuits which may conveniently employ semiconductor diodes. The output of the doublers, a pulse waveform with a recurrence frequency of 4 mcs., is applied to the base connection of a first normally conducting transistor. In addition, the fundamental frequency of 1 mc. is applied to the base electrode of the normally conducting transistor to render it alternately heavily- and non-conducting. During the period the transistor is heavily conducting the pulse signal from the frequency doubler arriving at the base of the transistor is of the correct polarity to render it non-conducting for the pulse period. The collector circuit of the transistor contains a pulse peaking transformer with an associated rectifier which damps out the unwanted half cycle of the pulse waveform produced by the continued action of the two signals applied to its base electrode.

The pulse so produced by the first transistor is fed to a further transistorized pulse shortening circuit which produces a pulse containing harmonics up to 70 mcs. The pulse shortening transistor circuit is characterized by the absence of a source of supply voltage for the collector thereof.

The pulse thus produced may be employed for frequency control or other use requiring a pulse rich in harmonics.

My invention will now be described by way of example with reference to the single figure of the drawing showing the preferred embodiment thereof.

A crystal controlled sine wave oscillator comprises a pair of transistors $T_1$ and $T_2$ in a push-pull type oscillator circuit whose frequency is maintained constant by a crystal 1 connected between the bases of $T_1$ and $T_2$. A circuit tuned to the crystal frequency constituted by inductance 8 and capacitor 10 is connected between the emitters of $T_1$ and $T_2$. The centre point of inductance 8 is connected to ground potential. Feedback capacitors 6 and 7 are connected between the emitter and base electrodes of transistors $T_1$ and $T_2$ respectively. Operating voltage is supplied to the collectors of $T_1$ and $T_2$ through resistors 2 and 3 respectively. A negative potential is applied to resistors 2 and 3 through terminal 37 from a source of low voltage power which has its positive pole connected to grounded terminal 35. A negative bias is applied to the base of each transistor $T_1$ and $T_2$ through resistors 5 and 4 which are connected to the collectors of the respective transistors. Decoupling capacitors 9 are connected between the collectors of transistors $T_1$, $T_2$ and ground.

The sine wave output of the crystal controlled oscillator feeds a full wave rectifier frequency doubler system comprising two diodes 11, 12, a transformer 17 and a filter or biasing network constituted by a capacitor 13 and a resistance 14. The secondary of transformer 17 is tuned to the second harmonic of the crystal frequency by means of capacitor 18.

The tuned secondary of transformer 17 feeds a second rectifier frequency doubler system comprising a pair of diodes 19, 20, an untuned transformer 21, and a biasing or filter network 15, 16.

The secondary of transformer 21, one end of which is grounded feeds the redoubled frequency, the fourth harmonic of the crystal frequency, to the base of an unbiased transistor $T_3$. The collector circuit of $T_3$ is constituted by a peaking transformer 27 shunted by a diode 26 in series with a resistance 25, the other end of which is connected to negative terminal 37. A decoupling capacitor 24 is connected between the junction of resistor 25, the primary of peaking transformer 27 and ground.

In addition to the fourth harmonic voltage fed into the base of transistor $T_3$, the fundamental frequency is coupled through the circuit consisting of inductance 22, the secondary of transformer 21 and capacitor 23 which form a circuit tuned to the fundamental frequency.

The secondary of peaking transformer 27 feeds the base of transistor $T_4$. A negative potential is applied to the base electrode of $T_4$ through the medium of resistors 29, 30 connected between terminals 35 and 37 and the secondary of transformer 27. Resistor 29 is bypassed to ground by capacitor 28 for frequencies of the pulse signal appearing in the secondary of transformer 27.

The emitter of transistor $T_4$ is grounded and a peaking transformer 32 in series with a biasing network comprising resistor 33 and capacitor 34 is connected between the collector of $T_4$ and ground. A damping diode 31 is connected across the primary of transformer 32. Although not absolutely necessary, it has been found advantageous, for reasons to be explained later, to not supply a negative potential to the collector of transistor $T_4$.

The output of the pulse generator may be taken off between the terminal 36 of the secondary of transformer 32 and ground.

The operation of the pulse generator will now be described.

For ease of explanation, it is assumed that the fundamental frequency of the oscillator comprising transistors $T_1$ and $T_2$ is 1 mc. This frequency is doubled in rectifier frequency doubler circuit 11, 12, 17. Bias network 13, 14 prevents undue damping of the tuned circuit 8, 10.

The secondary of transformer 17, tuned to 2 mc. by capacitor 18, feeds the second rectifier frequency doubler circuit 19, 20, 21. The 4 mc. signal thus produced is fed by the secondary winding of pulse transformer 21 to the base of transistor $T_3$.

Transistor $T_3$ is normally in an unbiased condition, conducting a small collector current, since the base and emitter are at ground potential. Resistor 25 is of such a value as to normally maintain the collector of $T_3$ at a low potential so that the rated dissipation will not be exceeded and also to prevent breakdown of the transistor at higher temperatures. The 1 mc. sine wave signal applied to the base of $T_3$ through 21, 22 and 23 is of sufficient amplitude to render $T_3$ alternately non-conducting and heavily conducting. The combination of capacitor 23 and inductance 22 imparts a 90° phase shift of the 1 mc. sine wave with respect to the 4 mc. sine wave applied to the base of $T_3$ so that the maximum point of the negative cycle corresponds about in time to that of a positive peak of the 4 mc. pulse signal applied through transformer 21.

The 4 mc. positive pulse signal is effective to override the negative bias provided by the 1 mc. signal to switch $T_3$ to substantially its cutoff state for the period of the pulse signal. Thus a narrow pulse of high amplitude is produced in transformer 27 and further oscillation therein is damped by diode 26. The output is a narrow pulse appearing at a repetition rate of 1 mc. Diode 26 is preferably of the semi-conductor type and does not conduct if the forward voltage across it approaches zero.

It was found that much superior results were obtained in switching $T_3$ from a collector saturation current state to a cutoff state by the 4 mc. signal. This provides a narrower pulse output than is obtained when the pulse is produced by switching on of the transistor as is normally done. The operation in accordance with my invention has been made possible by limiting the collector to emitter voltage of the pulsed transistor to a low value while applying such a base to emitter bias to provide a large collector current. In this manner dissipation ratings of the transistor are not exceeded. Further, by applying a gating signal to the transistor base electrode, an additional gain in maximum collector current versus dissipation is achieved.

The base to emitter bias of transistor $T_3$ is obtained by peak-current detection of the wave produced across the secondary winding of transformer 21. Due to the self inductance of this secondary winding the current tends to remain constant and is only blocked during the short intervals in which the combined signal of the 1 mc. and the 4 mc. sine wave exhibits its positive maximum.

The pulse produced in transformer 27 is applied as a positive pulse to the base of transistor $T_4$. The base current of $T_4$ is large in the rest position due to the negative bias applied thereto by bleeder network 29, 30. The only voltage applied to the collector of $T_4$ is the drop produced across resistor 33 by the base current which flows to the collector and that produced by rectification of the flyback voltage in transformer 32 by diode 31. This prevents any breakdown of this transistor due to unduly large collector currents and facilitates use of a low current transistor.

Application of the positive pulse to the base of transistor $T_4$ is effective to interrupt the base current and produce a pulse in transformer 32 in the collector circuit. It should be noted here that the fall time of the transistor current is again employed for production of the pulse.

The 1 mc. pulse provided in the secondary of transformer 32 was found to be rich in harmonics, the amplitude of which at 70 mcs. was only 25% lower than that at 10 mcs. and eminently suitable for uses such as in a frequency stabilization system.

It should be understood that although the description was related to the use of P.N.P. type transistors, this is not critical since N.P.N. types may be used when the voltages are altered to correspond with their operation.

Since transistor $T_3$ conducts a low average current due to its being alternately switched off and on and transistor $T_4$ current is small due to the absence of a collector voltage supply, the power drain of the pulse generator is small. It should be noted that collector voltage may be applied to $T_4$ if the type of transistor employed operates more satisfactorily. Provision must be then made to prevent overload of the transistor by ensuring that a low collector to emitter voltage is maintained at all times.

Although a specific embodiment has been described, modifications of my invention will occur, to those skilled in the art, which do not depart from the spirit and scope of my invention as defined by the appended claims.

What is claimed is:

1. A pulse generator circuit comprising a transistor having emitter, base and collector electrodes, a pulse transformer having a primary and secondary winding, a source of operating potential, means connecting said primary winding between said collector electrode and one terminal of said source of potential, means connecting said emitter to the other terminal of said source, a source of signals connected to the base-emitter circuit of said transistor for making said transistor conductive, means for limiting the collector current of said transistor, and a source of pulses applied to the base-emitter circuit of said transistor for periodically making said transistor non-conductive, said pulses being a harmonic of said signals, said base-emitter circuit comprising the secondary winding of an input transformer, whereby the sole base-emitter bias of said transistor is derived solely by peak current detection of said signals and pulses by said transistor.

2. A pulse generator circuit comprising a first transistor having a first emitter, first base and first collector, a second transistor having a second emitter, a second base and a second collector, a source of operating potential, a first pulse transformer having a primary and secondary winding, means connecting said primary winding between said first collector and one terminal of said source, means connecting said first emitter to the other terminal of said source, a source of first signals connected to the base-emitter circuit of said first transistor for making said first transistor conductive, a source of second signals harmonically related to said first signals connected to said base-emitter circuit for periodically making said first transistor non-conductive, said base emitter circuit comprising the secondary winding of an input transformer whereby the sole base-emitter bias of said first transistor is derived from peak current detection of said signals by said first transistor, means connecting the secondary winding of said first pulse transformer to the base-emitter circuit of said second transistor, means rendering said second transistor normally conductive, a second pulse transformer having a primary winding and a secondary winding, rectifier means connected in parallel with said last-mentioned primary winding, and a parallel resistance-capacitance circuit serially connected with said last-mentioned primary winding between said second collector and second emitter whereby the sole collector voltage of said second transistor is derived from second base-collector current and rectification of fly-back pulses in said second pulse transformer by said rectifier means.

3. In a pulse generator circuit, a transistor having base, emitter, and collector electrodes, means connected between said base and emitter electrodes for making said transistor normally conductive, a source of pulses connected to said base electrode for periodically interrupting the collector current of said transistor, a pulse transformer having a primary and secondary winding, a rectifier connected in parallel with said primary winding, a parallel circuit of a resistor and capacitor, and means serially connecting said parallel circuit and said primary winding between said emitter and collector electrodes, whereby the sole collector electrode voltage of said transistor is derived from base-collector current and rectification of fly-back pulses in said second pulse transformer by said rectifier.

4. A pulse generator circuit comprising a transistor having emitter, base and collector electrodes, an input transformer having a first primary winding and a first secondary winding, a source of first signals, a source of second signals harmonically related to said first signals, means applying said second signals to said first primary winding, means applying said first signals to said first secondary winding, means connecting said first secondary winding between said base and emitter electrodes, a second transformer having a second primary winding and second secondary winding, a source of operating potential, and means serially connecting said second primary winding and source of potential between said collector and emitter electrodes, the base-emitter circuit being connected by direct current conductive means to one terminal of said source of potential whereby the base-emitter bias of said transistor is obtained solely by peak-current detection of said signals across said first secondary winding by said transistor.

5. The circuit of claim 4, comprising resistance means connected in the path of the collector current of said transistor to limit the flow of said collector current.

6. The circuit of claim 4, comprising rectifier means connected in parallel with said second primary winding.

7. The circuit of claim 4, comprising means for shifting the phase of one of said signals with respect to the other whereby a peak of the higher frequency signal of sufficient amplitude to cut off said transistor occurs at the peak of the lower frequency signal rendering said transistor nonconductive, whereby a sharp output pulse is provided at said second secondary winding.

References Cited in the file of this patent

UNITED STATES PATENTS

| | | |
|---|---|---|
| 2,724,776 | Sherwin | Nov. 22, 1955 |
| 2,758,206 | Hamilton | Aug. 7, 1956 |
| 2,776,375 | Keiper, Jr. | Jan. 1, 1957 |
| 2,777,057 | Pankove | Jan. 8, 1957 |
| 2,849,626 | Klapp | Aug. 26, 1958 |
| 2,905,835 | Wray | Sept. 22, 1959 |